US008373407B2

(12) United States Patent  
Banhegyesi

(10) Patent No.: US 8,373,407 B2  
(45) Date of Patent: Feb. 12, 2013

(54) INTELLIGENT ELECTRONIC DEVICE HAVING IMPROVED ANALOG OUTPUT RESOLUTION

(75) Inventor: Tibor Banhegyesi, Baldwin, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 28 days.

(21) Appl. No.: 12/055,493

(22) Filed: Mar. 26, 2008

(65) Prior Publication Data

US 2008/0238406 A1  Oct. 2, 2008

Related U.S. Application Data

(60) Provisional application No. 60/920,128, filed on Mar. 27, 2007.

(51) Int. Cl.  
*G01R 19/18* (2006.01)

(52) U.S. Cl. ...... 324/120; 324/142; 324/99 D; 324/115; 702/57; 702/60; 702/64

(58) Field of Classification Search ............... 324/158.1, 324/126, 755, 523, 139, 142, 116  
See application file for complete search history.

(56) References Cited

U.S. PATENT DOCUMENTS

| 5,122,735 | A  | * | 6/1992  | Porter et al. ............... 324/142 |
| 5,250,948 | A  | * | 10/1993 | Berstein et al. ............. 341/131 |
| 5,706,214 | A  | * | 1/1998  | Putt et al. .................. 700/286 |
| 5,781,142 | A  | * | 7/1998  | Onodera et al. ............. 341/169 |
| 5,825,318 | A  | * | 10/1998 | Patapoutian et al. ......... 341/131 |
| 5,924,051 | A  | * | 7/1999  | Provost et al. ............... 702/61 |
| 6,112,159 | A  | * | 8/2000  | Bond et al. ................... 702/61 |
| 6,559,631 | B1 | * | 5/2003  | Balch et al. ................ 324/142 |
| 6,744,389 | B2 | * | 6/2004  | Haeberli et al. ............. 341/118 |
| 6,747,588 | B1 | * | 6/2004  | Huang et al. ................ 341/156 |
| 6,825,670 | B2 | * | 11/2004 | Bussinger .................... 324/523 |
| 6,873,144 | B2 | * | 3/2005  | Slater et al. ................ 324/142 |
| 6,984,979 | B1 | * | 1/2006  | Edel .......................... 324/253 |
| 6,995,700 | B2 | * | 2/2006  | Roger et al. ................ 341/144 |
| 7,064,558 | B1 | * | 6/2006  | Bentley ...................... 324/651 |
| 7,239,125 | B2 | * | 7/2007  | Hemminger et al. .......... 324/142 |
| 7,337,081 | B1 | * | 2/2008  | Kagan ......................... 702/60 |
| 7,688,061 | B2 | * | 3/2010  | Briese et al. ............... 324/142 |
| 7,916,060 | B2 | * | 3/2011  | Zhu et al. ................... 341/155 |
| 7,996,171 | B2 | * | 8/2011  | Banhegyesi .................. 702/85 |
| 8,078,418 | B2 | * | 12/2011 | Banhegyesi et al. ........... 702/64 |
| 8,160,824 | B2 | * | 4/2012  | Spanier et al. ................ 702/57 |
| 2006/0170409 | A1 | * | 8/2006  | Kagan et al. .................. 324/74 |
| 2008/0197839 | A1 | * | 8/2008  | Machul et al. ............... 324/236 |
| 2008/0282808 | A1 | * | 11/2008 | Trieu et al. ................ 73/861.27 |

\* cited by examiner

*Primary Examiner* — Richard Isla Rodas  
(74) *Attorney, Agent, or Firm* — Gerald E. Hespos; Michael J. Porco; Matthew T. Hespos

(57) ABSTRACT

A method and apparatus provides improved resolution in an analog signal, relative to the resolution of a digital-to-analog converter producing the signal. In one embodiment, a digital electrical power and energy meter varies a digital input to a digital-to-analog converter such that an average of the output of the digital-to-analog converter indicates a value with greater resolution than the instantaneous resolution of the digital-to-analog converter.

40 Claims, 9 Drawing Sheets

| Parameter Value (P) | Closest Values (R1 and R2) | Digital Inputs (DR1 and DR2) | Duty Cycle | Datagrams | | |
|---|---|---|---|---|---|---|
| -7.50 | -8.00<br>-7.00 | 0000<br>0001 | 50%<br>50% | 0000 | 0001 | 0001 |
| -5.25 | -5.00<br>-6.00 | 0011<br>0010 | 75%<br>25% | 0011 | 0010 | 0011 |
| 0.25 | 0.00<br>1.00 | 1000<br>1001 | 75%<br>25% | 1000 | 1001 | 1000 |
| 1.50 | 2.00<br>1.00 | 1010<br>1001 | 50%<br>50% | 1010 | 1001 | 1001 |
| 2.75 | 2.00<br>3.00 | 1010<br>1011 | 25%<br>75% | 1011 | 1010 | 1011 |
| 3.25 | 3.00<br>4.00 | 1011<br>1100 | 75%<br>25% | 1011 | 1011 | 1011 |
| 4.50 | 4.00<br>5.00 | 1100<br>1101 | 50%<br>50% | 1100 | 1100 | 1101 |
| 6.00 | 6.00 | 1110 | 100% | 1110 | 1110 | 1110 |

*FIG. 7*

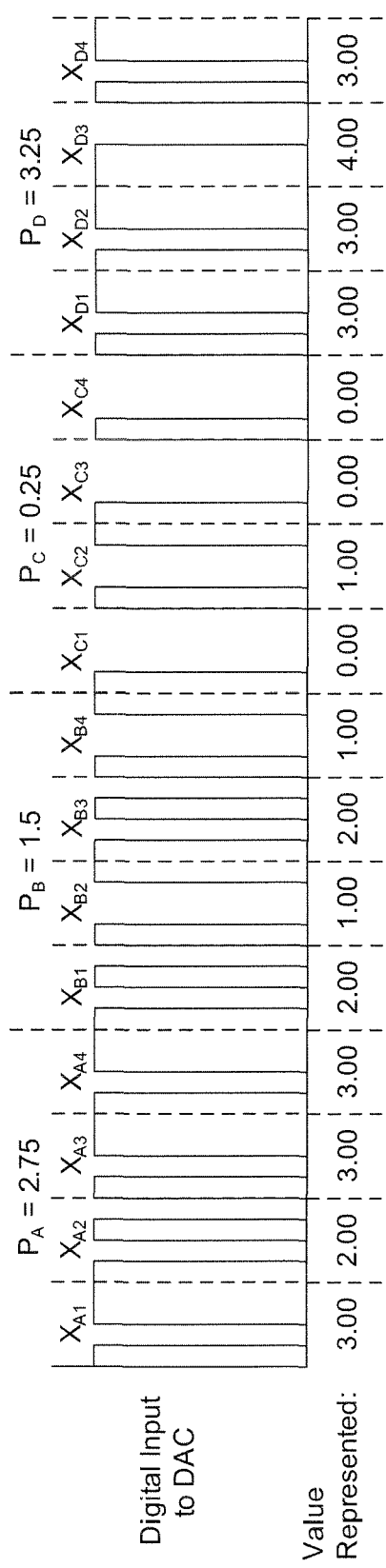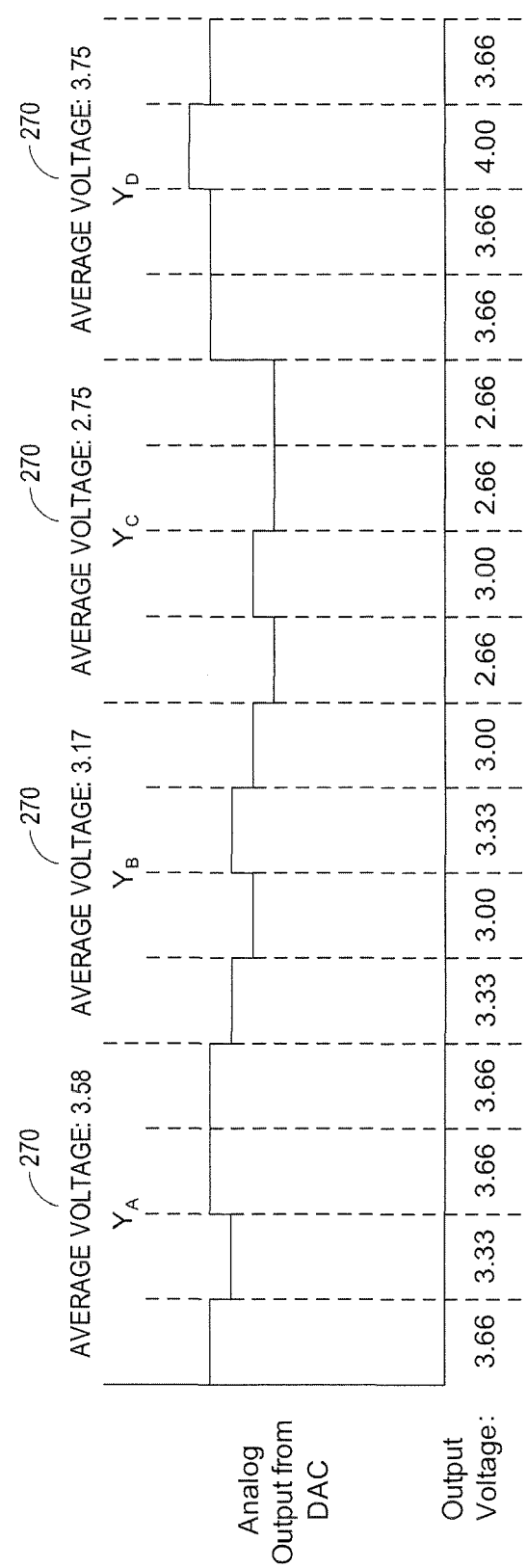

INTELLIGENT ELECTRONIC DEVICE HAVING IMPROVED ANALOG OUTPUT RESOLUTION

CROSS-REFERENCE TO RELATED PATENTS AND PATENT APPLICATIONS

This application claims priority to U.S. Provisional Patent Application No. 60/920,198, filed on Mar. 27, 2007, which is herein incorporated by reference.

FIELD OF TECHNOLOGY

The present disclosure relates generally to the field of intelligent electronic devices for electrical utility services and, more specifically, to digital electrical power and energy meters for the electrical utility services.

BACKGROUND

Producers, suppliers, and consumers of electrical power rely on energy meters to monitor power consumption and quality for numerous purposes, including billing and revenue, distribution, and process management. Traditionally, the primary means of measuring power consumption was an electromechanical power meter. A number of other types of meters and equipment measured other parameters of power generation, distribution, usage, and quality. As technology has improved, intelligent electronic devices (IEDs), such as digital power and energy meters, Programmable Logic Controllers (PLCs), electronically-controlled Remote Terminal Units (RTUs), protective relays, fault recorders, and the like, have slowly replaced their electro-mechanical and analog counterparts.

The shift to IEDs from analog and electro-mechanical devices provides a vast array of advantages including improvements in measurement accuracy (e.g., voltage, current, power consumption, power quality, etc.), system control (e.g., allowing a meter to trip a relay or a circuit breaker), and versatility (e.g., allowing a meter to share its data with another device). IED's typically implement system control and information sharing within in the analog signal realm. That is, a meter (or other IED) may provide an analog signal, such as a 0-1 mA signal, a 4-20 mA signal, a 0-5 V signal, or other analog signal, to another device. However, when an IED provides an analog output to share information with another device, or to control another device, the analog output frequently has a lower resolution than the data or control information conveyed by the analog signal. This deficiency is due, in part, to the cost of high-resolution digital-to-analog converters.

SUMMARY OF THE DISCLOSURE

A disclosed method for outputting analog data to an external device of a digital electrical power and energy meter provides enhanced signal resolution. Specifically, the method effectively increases the resolution of the analog output above the resolution of an included digital-to-analog converter. More particularly, a method for improving the resolution of an analog signal relative to a digital signal, the analog and digital signals representative of a numerical value, includes forming, from one or more sensors operatively coupled with an AC electrical service, one or more first analog signals representative of at least a voltage or a current of the AC electrical service. The method then converts the one or more first analog signals into one or more first digital signals representative of the one or more analog signals and receives at, for example, a processor, the one or more first digital signals. The method then determines from at least one of the one or more first digital signals, a value of a parameter of the AC electrical service and transmits a second digital signal indicative of the value of the parameter of the AC electrical service. Importantly, the second digital signal includes a plurality of datagrams, each datagram having a first resolution. The method then receives the second digital signal indicative of the value of the parameter, wherein the plurality of datagrams have an average value indicative of the value of the parameter, the average value having a second resolution exceeding the first resolution.

If desired, the method may convert the second digital signal indicative of the value of the parameter of the AC electrical service to a second analog signal indicative of the value of the parameter of the AC electrical service. Moreover, if desired, the parameter of the AC electrical service may be indicative of or represent one of energy, revenue, real power, reactive power, total power, a power factor, or an instantaneous or root mean square (RMS) value of one of a line voltage, a line current, a phase voltage, a phase current, and a total harmonic distortion.

BRIEF DESCRIPTION OF THE DRAWINGS

FIG. 7 depicts a table illustrating exemplary values of a parameter and associated digital input signals corresponding to each value of the parameter.

FIG. 10 depicts one possible group of digital signals communicated from a processor to an input of a digital-to-analog converter, and representing four values of a parameter.

FIG. 11 depicts the analog output signals from a digital-to-analog converter, corresponding to the digital input signals of FIG. 10, and representing four values of a parameter.

Figure 1:
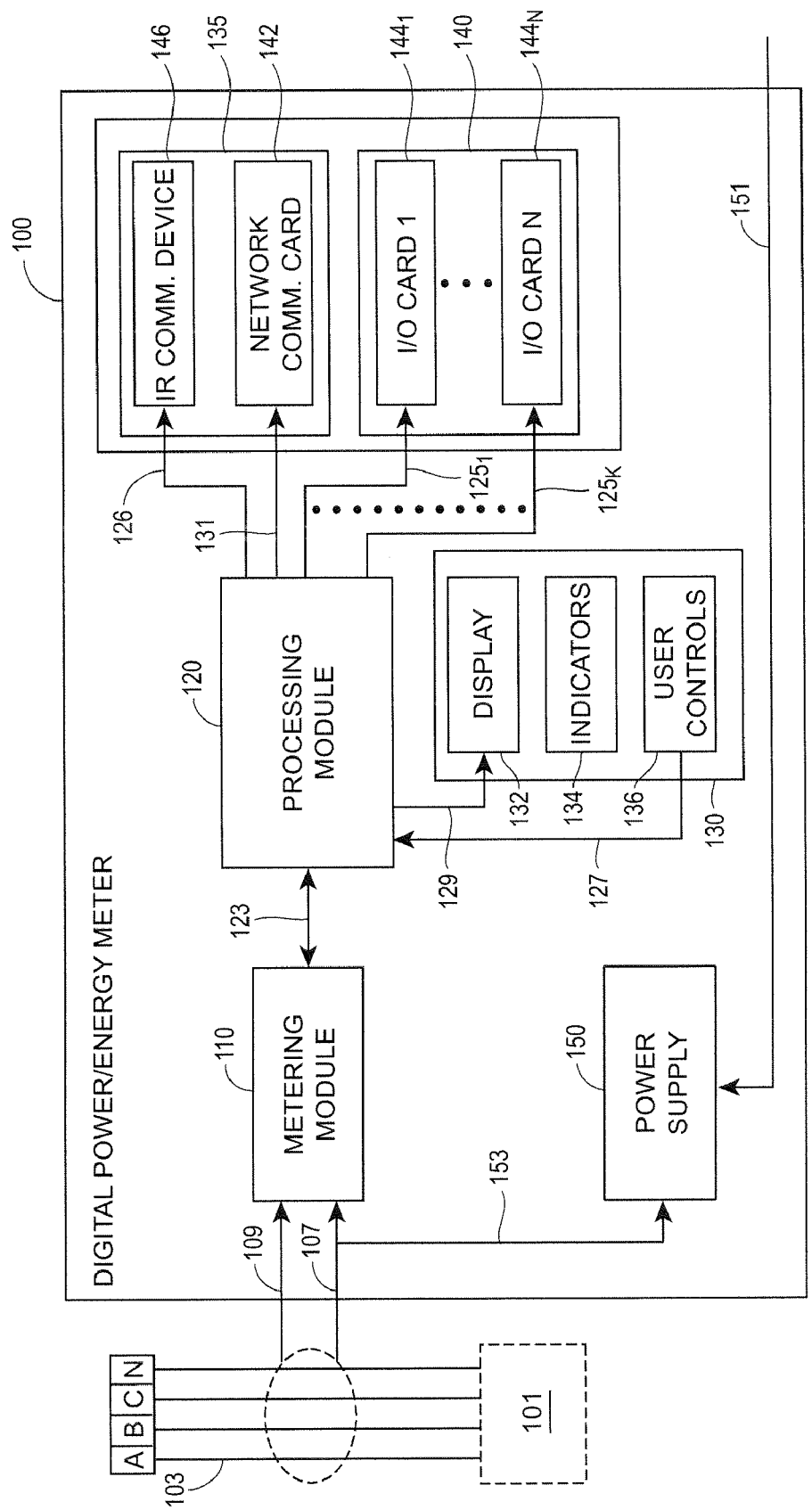
FIG. 1 is a block diagram of an exemplary digital electrical power and energy meter.

To facilitate understanding, identical reference numerals have been used, where possible, to designate identical elements that are common to the figures, except that suffixes may be added, when appropriate, to differentiate such elements. The images in the drawings are simplified for illustrative purposes and are not depicted to scale.

The appended drawings illustrate exemplary embodiments of the present disclosure and, as such, should not be considered as limiting the scope of the disclosure that may admit to other equally effective embodiments. It is contemplated that features or steps of one embodiment may beneficially be incorporated in other embodiments without further recitation.

DETAILED DESCRIPTION

While the present figures and description are specifically directed to a digital electrical power and energy meter, the concepts disclosed in the present disclosure may also be applied in the context of other types of Intelligent Electronic Devices (IEDs) including, for example, Programmable Logic Controllers (PLCs), Remote Terminal Units (RTUs), protective relays, fault recorders, and other devices or systems used to quantify, manage, and control quality, distribution, and consumption of electrical power. Thus, as used herein, the term "digital electrical power and energy meter" refers broadly to any IED adapted to record, measure, communicate, or act in response to one or more parameters of an electrical service. These parameters may include, for example, supply currents and supply voltages, their waveforms, harmonics, transients, and other disturbances, and other corresponding parameters, such as power, power quality, energy, revenue, and the like. A variety of electrical service environments may employ IEDs and, in particular, may employ digital electrical power and energy meters. By way of example and not limitation, these environments include power generation facilities (e.g., hydroelectric plants, nuclear power plants, etc.), power distribution networks and facilities, industrial process environments (e.g., factories, refineries, etc.), and backup generation facilities (e.g., backup generators for a hospital, a factory, etc.).

FIG. 1 depicts a block diagram of an exemplary digital meter 100. The meter 100 generally comprises a plurality of modules, each module having one or more dedicated tasks. In one embodiment, the modules are disposed on a plurality of printed circuit boards (PCBs). A meter housing (not shown) encloses the collection of modules.

More particularly, a metering module 110 includes voltage and current sensing circuitry and, in the embodiment depicted, measures or calculates one or more parameters associated with the electrical load or service (e.g., voltage, current, energy, etc.). A current interface 107 and a voltage interface 109 couple the metering module 110 to an electrical service 101 to be measured and/or monitored. For example, the interfaces 107 and 109 may couple the metering module 110 to supply lines 103 A, B, C, and N, of the three-phase electrical service 101 of FIG. 1. As used herein, the terms "coupled" and "connected" are defined to mean directly connected to or indirectly connected to through one or more intermediate components. Such intermediate components may include both hardware and software based components.

A processing module 120 facilitates operation and administration of the meter 100 and processes data obtained from the metering module 110 via an interface 123. A user interface module 130 displays results of measurements and calculations and allows configuration of the meter 100, via a display 132, a plurality of indicators 134, and a plurality of user controls 136. An interface 129 couples the display 132 to the processing module 120. Similarly, an interface 127 couples the user controls 136 to the processing module 120. A communications module 135 facilitates communication of data to one or more external devices (not shown), couples the meter to one or more remote terminals (not shown), and/or allows remote configuration of the meter 100. The communications module 135 includes an infrared communication device (and related circuitry) 146, coupled to the processing module 120 by an interface 126, and may optionally include a network communication card 142 coupled to the processing module 120 by an interface 131. An I/O module 140 may also include one or more input/output (I/O) cards 144, coupled to the processing module 120 by an interface 125. A power supply 150 provides power to the various components and modules of the meter 100.

While some of the modules of FIG. 1 (e.g., the metering module 110, the processing module 120, and the power supply 150) may be required for meter operation, other modules in the preferred embodiment are optional and may be omitted or replaced with other modules. Electrical connections embedded in the PCBs and/or electrical connectors coupling the PCBs communicatively connect each of the modules 110, 130, 135, 140, and 150 to the processing module 120, and each of the modules 110, 120, 130, 135, and 140 to the power supply 150. The power supply 150 is also communicatively coupled to a source of power. For example, a connection 151 may couple the power supply 150 to an external power source (not shown). Alternatively, a connection 153 may couple the power supply 150 directly to the electrical service 101.

Figure 2:
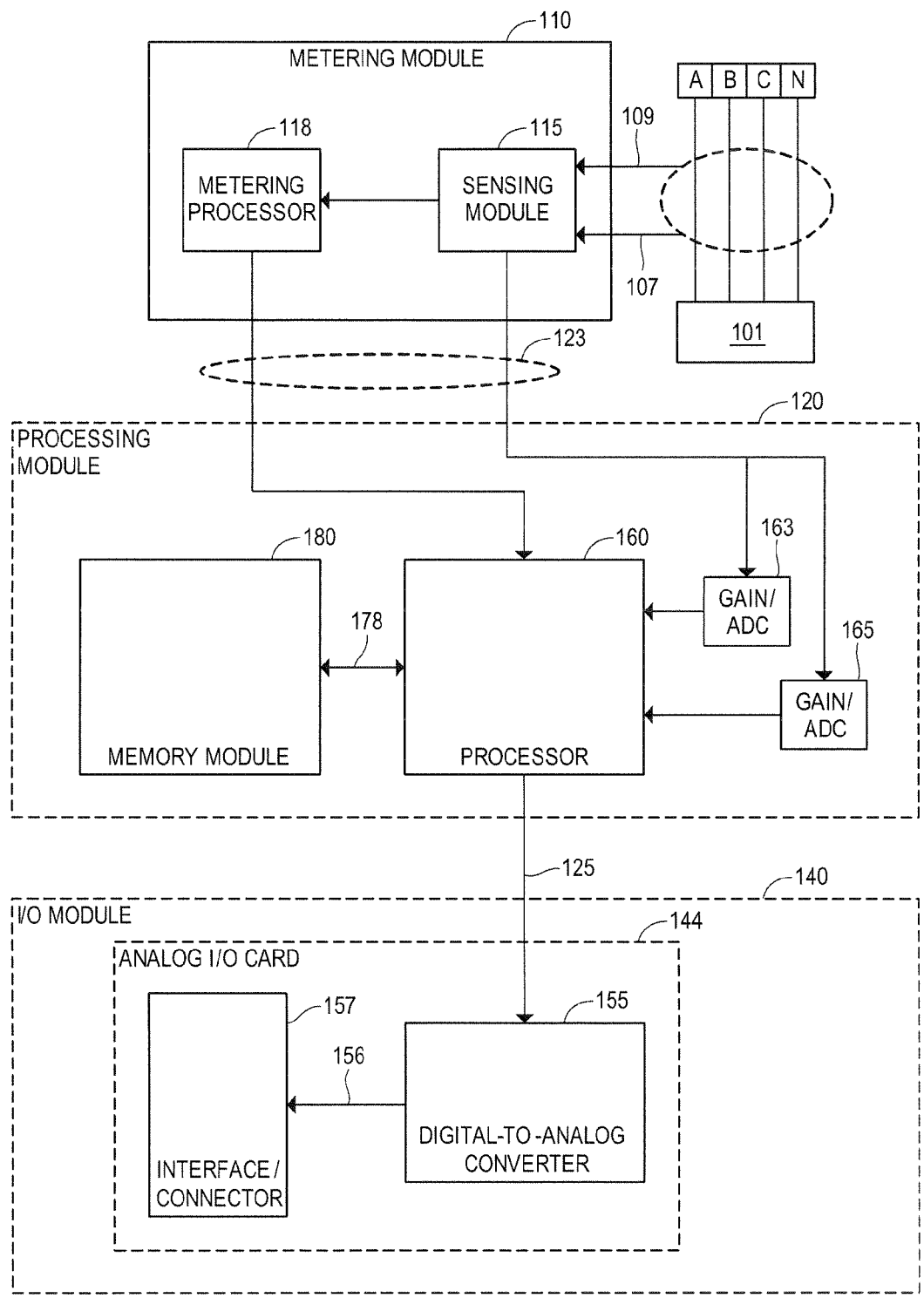
FIG. 2 is a block diagram of the metering module, processing module, and I/O module of the exemplary meter of FIG. 1.

Referring now to FIG. 2, the metering module 110 may include a sensing module 115 for sensing the currents and voltages on the interfaces 107 and 109, respectively, and for generating a signal representative of each sensed current or voltage. The sensing module 115 includes voltage sensing circuitry (not shown) connected to the voltage interface 109, and current sensing circuitry (not shown) connected to the current interface 107. In the depicted embodiment, the metering module 110 also includes circuitry (not shown) for applying a gain factor to each of the voltage and current signals, and for converting the analog signal representative of the sensed current or voltage to a digital signal, e.g., using an analog-to-digital converter (ADC). A metering processor 118 calculates one or more parameters of the electrical service 101. In particular, the metering processor 118 of the current embodiment calculates energy usage.

An interface 123 communicatively couples the metering module 110 to the processing module 120. The interface 123 may include one or more buses connecting, for example, the metering processor 118 and the sensing module 115 to the processing module 120. In one embodiment, the interface 123 includes two analog signal paths extending from the sensing module 115 to the processing module 120, and digital data paths (e.g., address and data buses, a serial peripheral interface, etc.) connected between the metering processor 118 and the processing module 120. The analog signal paths form additional analog channels, which may carry analog signals representative of the sensed current and the sensed voltage, for use by the processing module 120 (e.g., for waveform capture or for calculating total harmonic distortion). Additional interfaces may communicatively couple the processing module 120 to the user interface module 130 (e.g., interfaces 127 and 129) and the communications and/or I/O modules 135 and 140, respectively (e.g., interfaces 131, 125). The interfaces may be any type of known physical interface, and may be any appropriate logical interface. For example, where each module resides on a separate printed circuit board (PCB), the physical interface may include cables, header/receptacle connectors, card-edge connectors, or stackable connectors. The logical interface may include a serial peripheral interface (SPI), parallel data/address buses, etc. Further, multiple modules may reside on a single PCB, allowing the modules to be connected via connections embedded in the PCB. Additionally, the modules need not be physically distinct from one another, nor need the modules be physically segregated.

In the embodiment depicted in FIG. 2, the processing module 120 includes at least a processor 160 (e.g., a microprocessor, a digital signal processor (DSP), etc.) and a memory module 180 having one or more computer-readable storage devices (e.g., memories). An interface 178 connects the processing module 120 to the memory module 180. The interface 178 may be any known interface and may be compatible with the particular memory device or devices 180 being employed and with the particular processor 160, as known by those of ordinary skill in the art. The processing module 120 may also include additional elements, such as a real-time clock (not shown), a backup power source, e.g., a battery (not shown), and various other types of support circuitry (not shown).

Additionally, the processing module 120, or the processor 160, may include circuitry 163 and 165 for implementing gain control on the additional voltage and current signal channels coming from sensing module 115 as part of interface 123 and for converting the analog signals representative of the sensed currents and voltages to digital signals (e.g., using one or more ADCs). The processor 160 may use the additional channels, each of which includes a voltage signal and a current signal for each phase of the electrical service 101, and may use corresponding circuitry 163 and 165 for metering tasks that require different gain factors than the gain factors used in the energy metering functions executed on the metering module 110, to fully utilize the dynamic range of the corresponding ADC. In particular, the processor 160 may use one additional signal channel to provide waveform capture functionality. In contrast to calculating energy consumption (or generation), waveform capture has a much larger dynamic range to capture transients such as voltage spikes (which may exceed the nominal voltage of the system by orders of magnitude). The processor 160 may use another additional voltage signal channel and current signal channel for calculating harmonic effects in the electrical service. As would be known to those of ordinary skill in the art, capturing this information requires yet a different dynamic range, and thus a different gain setting.

The processing module 120 and, in particular, the processor 160, is communicatively connected to an I/O card 144 in the I/O module 140. Alternatively, the I/O card 144 may have its own processor (not shown), that receives data (e.g., from the processor 160), and that manipulates the data in some manner. The I/O card 144 may be any type of I/O card, and may provide either an analog or a digital interface to another device. For example, the I/O card 144 may provide an analog output, such as a 0-1 mA output, a 4-20 mA output, or a 0-5 V output, as illustrated in FIG. 2.

In one embodiment, the analog I/O card 144 includes the interface 125 connected to the processor 160. The I/O card 144 also includes a digital-to-analog converter (DAC) 155 for converting one or more digital signals into corresponding analog signals. The DAC 155 may be any type of DAC known to those of ordinary skill in the art. The DAC 155 may be of any desired resolution (e.g., 10-bit, 12-bit, 14-bit, etc.) sufficient for the purposes for which the output is to be employed. For example, if the output must be able to specify 1024 output levels, a 10-bit DAC is required ($2^{10}=1,024$). If the output is a 0-5 V analog output, each of the 1,024 levels that the DAC 155 could specify is equivalent to approximately 4.9 mV. Likewise, the DAC 155 may be of any desired speed, so long as the DAC 155 is capable of performing the required conversions as frequently as necessary. Of course, the DAC 155 may also be a multi-channel DAC, such as a quad DAC.

Figure 3:
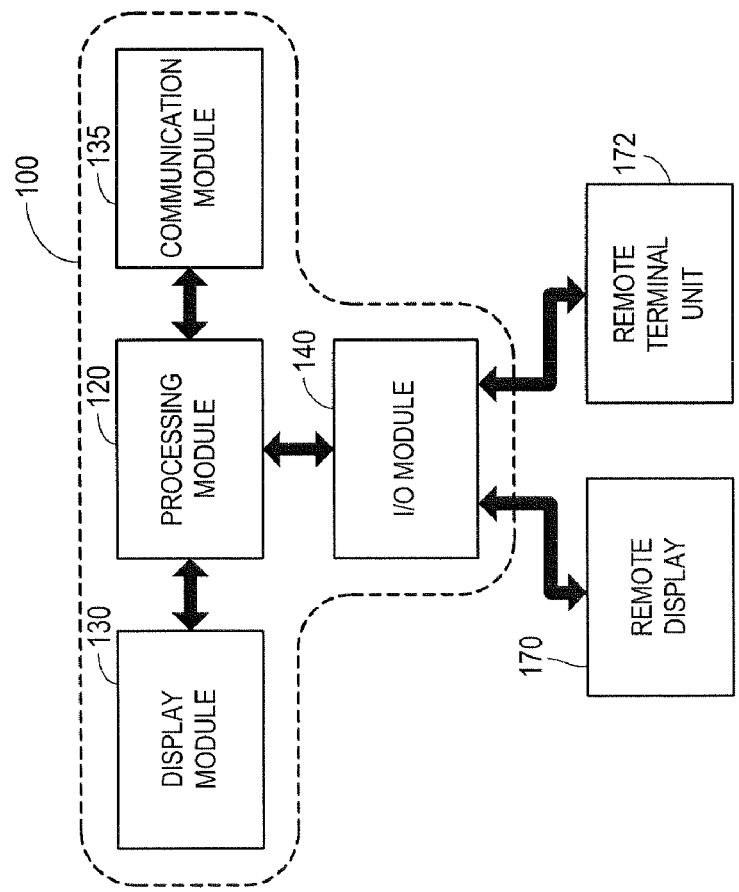
FIG. 3 illustrates one configuration of a system including the exemplary meter of FIG. 1

The analog signal (or signals, if the DAC 155 is a multi-channel device) output from the DAC 155 is communicated via a communication path 156 to an interface or connector 157. With reference now to FIG. 3, the I/O module 140 may communicate the analog signal to an external device, such as a remote display 170, for displaying the value corresponding to the analog signal at a remote location such as a control room. Alternatively, the I/O module 140 may communicate the analog signal to a remote terminal unit (RTU) 172, for example, to cause the RTU to perform some action.

Figure 4A:
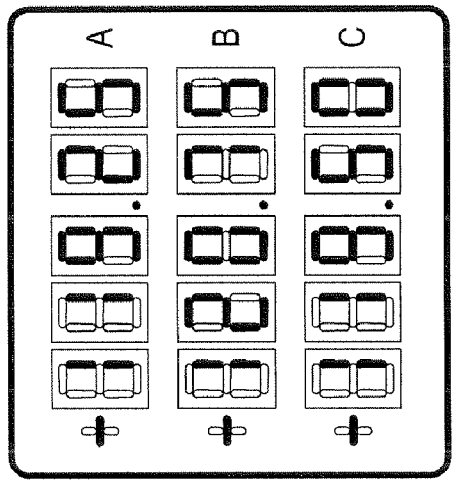
FIGS. 4A and 4B illustrate possible readouts displayed by a remote display in the system of FIG. 3.
Figure 4B:
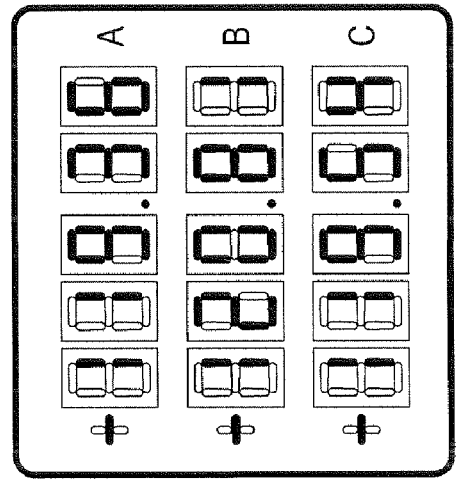

FIGS. 4A and 4B depict exemplary readings displayed by the remote display 170 when the meter 100 is connected to a three-phase system, such as the electrical service 101, and is measuring, for each phase, a parameter of the three-phase system. In this example, the measured parameter varies between approximately ±120.00 units and, therefore, has an approximate total range of 240.00 units. The meter 100 is also outputting, via the I/O module 140, a 0 V-5 V analog signal, representative of the measured parameter, to the remote display 170. FIG. 4A depicts a set of exemplary readings when the DAC 155 in the I/O module 140 is a 10-bit DAC, and the remote display 170 is calibrated to indicate values in the range ±128.00 A 10-bit DAC indicates 1024 values and, thus, in this example, the I/O module 140 indicates values between −128.00 and +128.00 in increments of 0.25 (i.e., a range of 256.00 represented by 1024 values).

FIG. 4B depicts a set of exemplary readings under the same conditions described above with respect to FIG. 4A, except that the DAC 155 in the I/O module 140 is a 12-bit DAC. A 12-bit DAC indicates 4069 values and, therefore, can provide four times the resolution, allowing the remote display 170 to display values between −128.00 and +128.00 in increments of approximately 0.06 (i.e., a range of 256.00 represented by 4096 values). Thus, the readings displayed by the remote display 170 are four times more precise when the I/O module 140 includes a 12-bit DAC 155 than when the I/O module 140 includes a 10-bit DAC 155.

Figure 5:
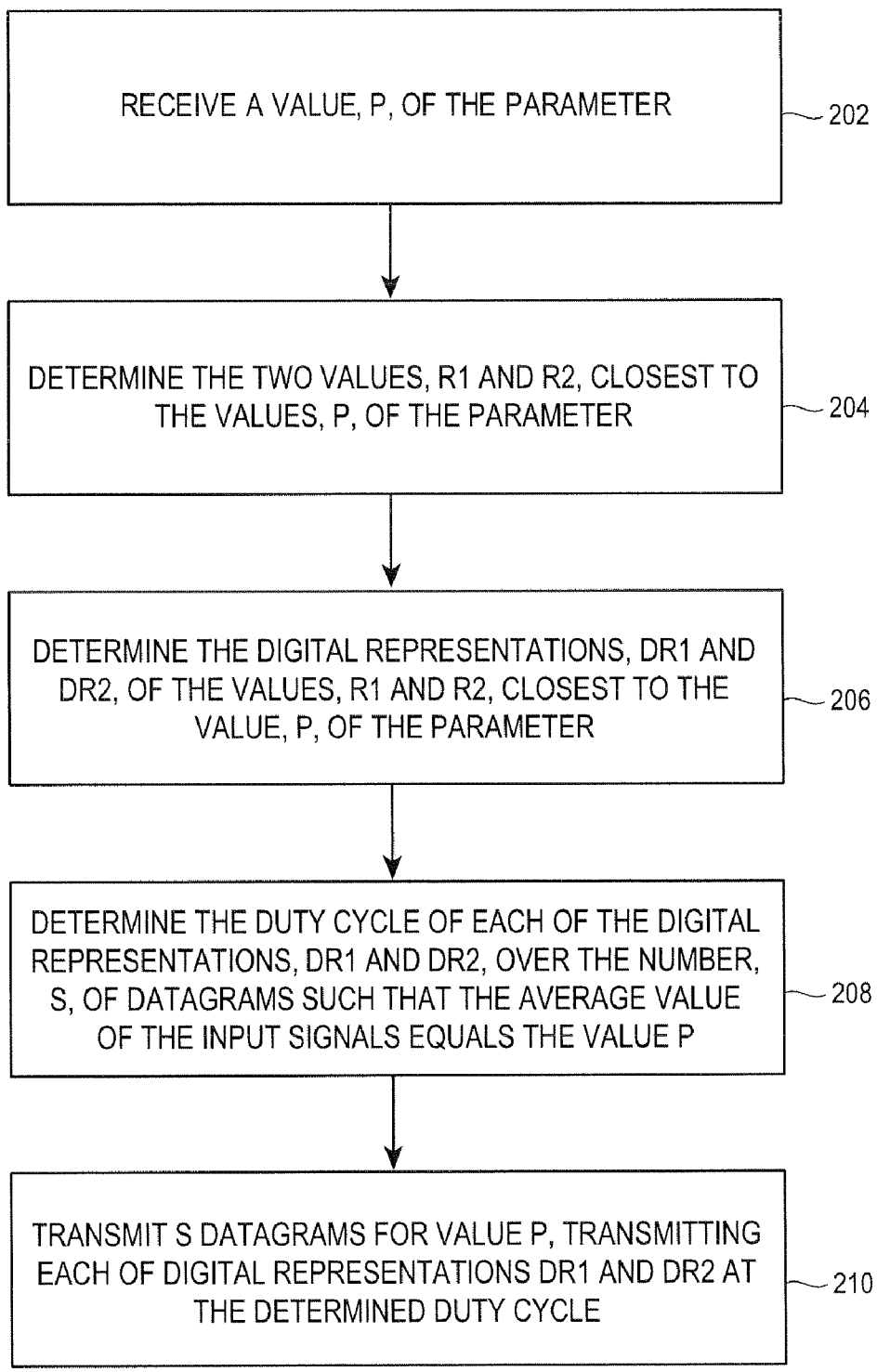
FIG. 5 illustrates a method of increasing the effective resolution of an analog signal output by a digital-to-analog converter.

The meter 100 may achieve an effective increase in resolution without actually increasing the resolution of the DAC 155 in the I/O module 140. FIG. 5 depicts an exemplary method 200 for providing increased resolution of a value of a parameter. In a step 202, the I/O card 144 receives a value P of a measured or calculated parameter. The parameter may be any measured or calculated parameter relating to the AC electrical service 101, including, by way of example, energy, revenue, real power, reactive power, total power, a power factor, or an instantaneous or root mean square (RMS) value of one of a line voltage, a line current, a phase voltage, a phase current, and a total harmonic distortion (THD). The value P may be a static value or, if the parameter is a time-varying parameter, the value P may be one of a series of values of the parameter, each value in the series corresponding to a discrete point in time.

Figure 6:
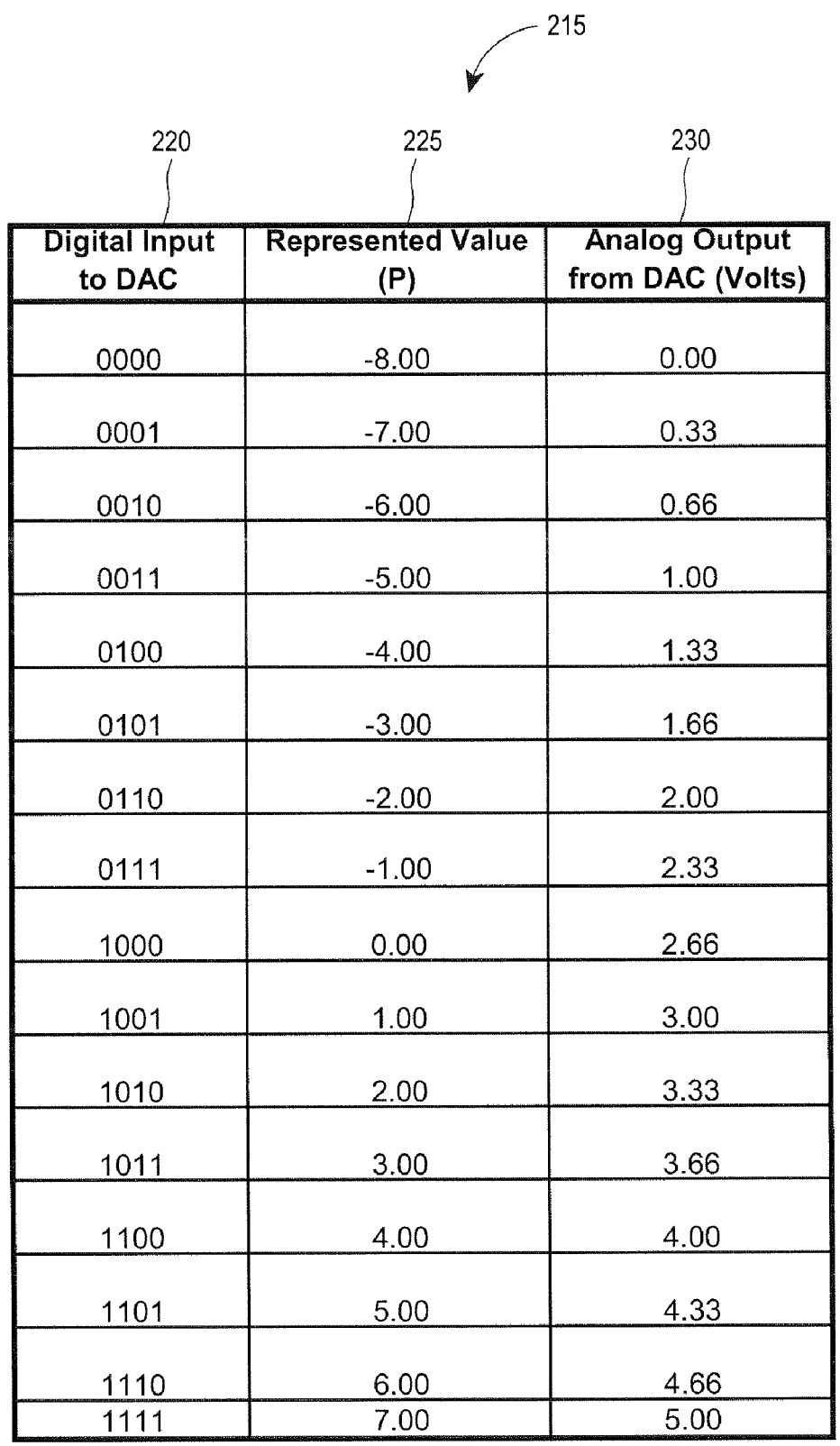
FIG. 6 depicts a table illustrating the possible digital input signals to a 4-bit digital-to-analog converter, the analog output signals corresponding to the digital input signals, and exemplary parameter values associated with each possible digital input signal.

The current method employs the transmission of a plurality of datagrams (FIG. 8) to represent each value P, each datagram including a string of binary values indicative of the value P. The resolution of the DAC 155 determines the number of binary values in each datagram. For example, if the DAC 155 is a 4-bit DAC, each datagram is a string of four binary values. FIG. 6 depicts a table 215 illustrative of the values P of an arbitrary example parameter varying between −8.00 and +7.00. Columns 220, 225, and 230 of FIG. 6 illustrate each of the possible digital input strings, the value P of the parameter that the input string represents, and the analog output of the DAC 155 corresponding to each possible digital input string, respectively. For a 4-bit DAC 155 representing a parameter having values ranging from −8.00 to +7.00, and having an analog 0-5 V output, each possible digital input to the 4-bit DAC 155 represents an integer value of the arbitrary parameter, and causes the DAC 155 to output a proportional analog signal (e.g., a voltage between 0 V and 5 V). Of course, the mapping of the possible digital input strings to corresponding analog output values could be different than that illustrated in FIG. 6 (e.g., the most significant bit may indicate a negative value when set, effectively reversing the mapping of FIG. 6). A number S of datagrams is pre-determined, depending on the increase in resolution desired. For example, representing each value P by four datagrams yields an increase in resolution of two bits ($2^2$=4), representing each value P by eight datagrams yields an increase in resolution of three bits ($2^3$=8), and so forth.

In a step 204, the processor 160 (or a processor on the I/O card 144) determines the two values R1 and R2, represented by one of the possible input strings, that are closest to the value P of the parameter. FIG. 7 depicts a table 235 illustrative of several examples using the 4-bit DAC 155 and the parameter illustrated in table 215 of FIG. 6. A column 240 of the table 235 illustrates a plurality of exemplary values for the arbitrary parameter. A column 245 of the table 235 illustrates the values R1 and R2 that result from the execution of the step 204. For example, for a parameter value −7.50, the closest values R1 and R2 represented by the possible digital inputs (column 220) to the DAC 155 are −7.00 and −8.00. Similarly, for a parameter value +2.75, the closest values R1 and R2 represented by the possible digital inputs (column 220) to the DAC 155 are +2.00 and +3.00.

In a step 206, the processor 160 determines the digital representations DR1 and DR2 of the values R1 and R2 closest to the value P of the parameter (i.e., the processor 160 determines the digital input strings (column 220) that represent the values (column 245) determined in the step 204). A column 250 of the table 235 illustrates the values DR1 and DR2 that result from the execution of the step 206. For example, for the parameter value of −7.50, the digital input strings (column 250) that represent the values R1 and R2 (column 245) are 0000 and 0001. Likewise, for the parameter value of +2.75, the digital input strings (column 250) that represent the values R1 and R2 (column 245) are 1010 and 1011.

In a next step 208, the processor 160 determines the duty cycle of each of the digital representations DR1 and DR2 over the number S of datagrams, such that the average of the values represented by the S digital input signals equals the value P of the parameter. A column 255 of the table 235 depicts the duty cycles of each of the values resulting from the execution of the step 208, and corresponding to the digital inputs (column 250) DR1 and DR2. For example, for the parameter value of −7.50 described above, the duty cycle over four datagrams (S=4) of DR1 (0000) is 50%, and the duty cycle of DR2 (0001) is 50%. Likewise, for the parameter value of +2.75 described above, the duty cycle over four datagrams of DR1 (1010) is 25%, and the duty cycle of DR1 (1011) is 75%. In other words, the steps 204, 206, and 208, taken together, determine a value for each of the S datagrams, such that the average of the values represented by the S datagrams equals the value P of the parameter. A column 260 of the table 235 depicts the four datagrams for each of the example values P of the parameter in the column 240.

A step 210 transmits the S datagrams representing the value P of the parameter. In one embodiment, the method 200 occurs in a processor (not shown) on the I/O card 144. The processor on the I/O card 144 transmits the S datagrams representative of the value P to the DAC 155 on the I/O card 144. The DAC 155, therefore, outputs a series of S analog values, the average of which is the value P of the parameter. An analog device (not shown) coupled to the I/O card 144 receives the series of S analog values. For example, if the analog device is an analog voltmeter (i.e., a galvanometer), the voltmeter is calibrated such that the 0 V to 5 V analog signal (or other analog signal such as a 4-20 mA signal) from the I/O card 144 causes a needle on the voltmeter to move proportional to the signal, such that the needle points to the value indicated by that signal (i.e., a 2.50 V signal from the I/O card 144 causes the needle to point to the half-scale value). When the voltmeter receives the S datagrams transmitted by the I/O card 144 the voltmeter may, by virtue of the response time of the needle to the signal, "average" the S datagrams.

Alternatively, a digital device (not shown) that has an analog input may be coupled to the I/O card 144, and may receive the S datagrams transmitted by the I/O card 144. In this case, the digital device may be programmed to average the datagrams to effectively receive the value of the signal with the increased resolution. Of course, the method 200 could also be applied to digital data on a digital I/O card, by transmitting the S datagrams for the value P of the parameter directly to the external device (or to another module of the meter 100, such as the user interface module 130 or the communication module 135), and programming the external device (or other recipient of the data) to average the S datagrams to find the value P of the parameter (i.e., without converting the signal to an analog signal prior to transmitting it).

Figure 8:
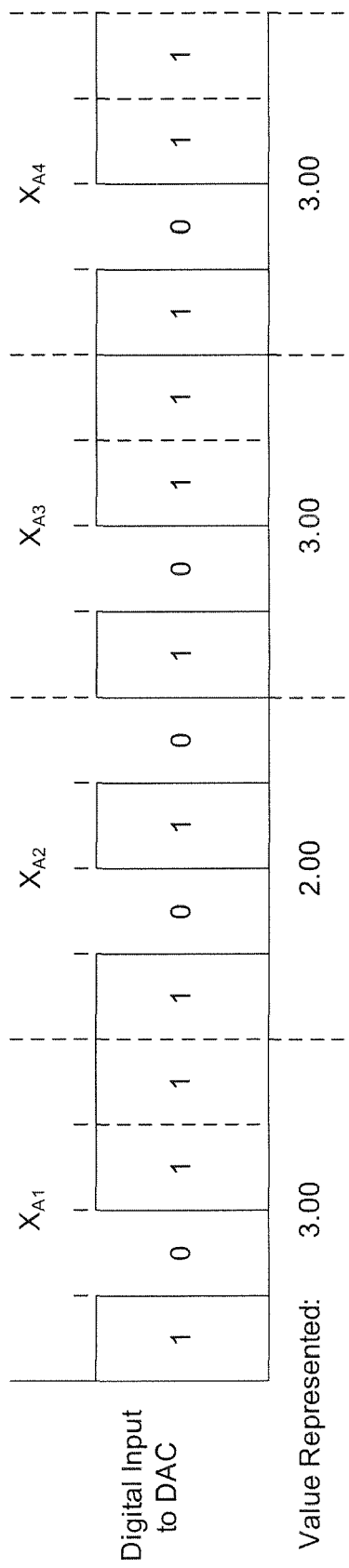
FIG. 8 depicts one possible group of digital signals communicated from a processor to an input of a digital-to-analog converter, and representing a single value of a parameter.
Figure 9:
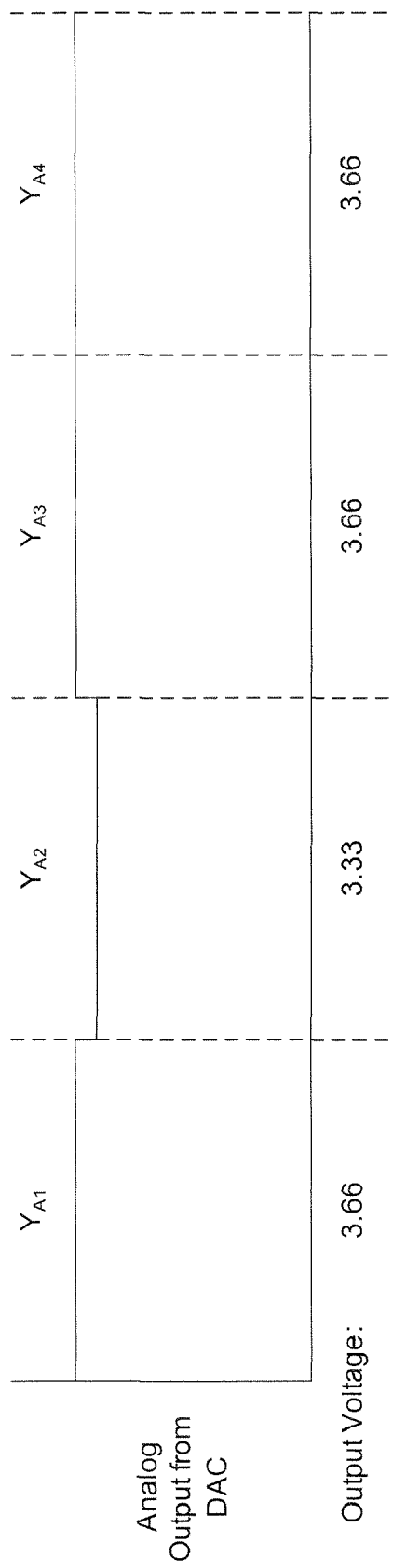
FIG. 9 depicts the analog output signals from a digital-to-analog converter, corresponding to the digital input signals of FIG. 8, and representing a single value of a parameter.

FIGS. 8 through 12 depict specific examples of the method 200. In FIGS. 8 and 9, the value P of the parameter is +2.75, the number S of datagrams per value P is 4, and each datagram has a 4-bit value (i.e., the DAC 155 is a 4-bit DAC). Thus, after receiving the value P in the step 202, execution of the step 204 yields values R1 and R2, +2.00 and +3.00, respectively. As illustrated in FIG. 8, execution of the step 206 yields digital representations DR1 and DR2, 1010 and 1011, respectively representing the values +2.00 and +3.00 (R1 and R2). Each of DR1 and DR2 is transmitted in a number of the S datagrams $X_{A1}$-$X_{A4}$ proportional to its respective duty cycle. Thus, DR2 (1010) is transmitted as one datagram $S_{A1}$ (i.e., 25%) of the four datagrams ($X_{A1}$-$X_{A4}$), and DR1 (1011) is transmitted as three (i.e., 75%) of the four datagrams. After transmission of each datagram X to the DAC 155, the DAC 155 outputs an analog value Y representative of the digital value, as illustrated in FIG. 9. Of course, the processor need not output all of the datagrams $X_{A1}$-$X_{A4}$ prior to processing by the DAC 155. Instead, the DAC 155 may output an analog value Y for each datagram X after receiving all of the bits of that datagram X. Thus, the time scales (x-axes) of FIGS. 8 and 9 are not aligned, but rather would be offset (i.e., the DAC 155 outputs analog value $Y_{A1}$ in FIG. 9 while the processor transmits the datagram $X_{A2}$ in FIG. 8, etc.).

FIG. 10 illustrates a series of values $P_A$ through $P_D$ of a parameter, each value represented by four datagrams ($X_{A1}$-$X_{A4}$, $X_{B1}$-$X_{B4}$, etc.). FIG. 11 illustrates the outputs $Y_{A1}$ through $Y_{D4}$ of the DAC 155, in response to the datagrams $X_{A1}$ through $X_{D4}$, and representing parameter values $P_A$ through $P_D$. FIG. 11 also provides an indication 270 of the average voltage output by the DAC 155 for each of the values $P_A$ through $P_D$ of the parameter. FIGS. 10 and 11, taken together, illustrate that a four-bit binary value (i.e., 0000-1111, representing parameter values −8.00 to +7.00) may, using the method 200, represent six bits worth of information (i.e., 64 parameter values −8.00 to +7.00 in increments of 0.25).

Figure 12:
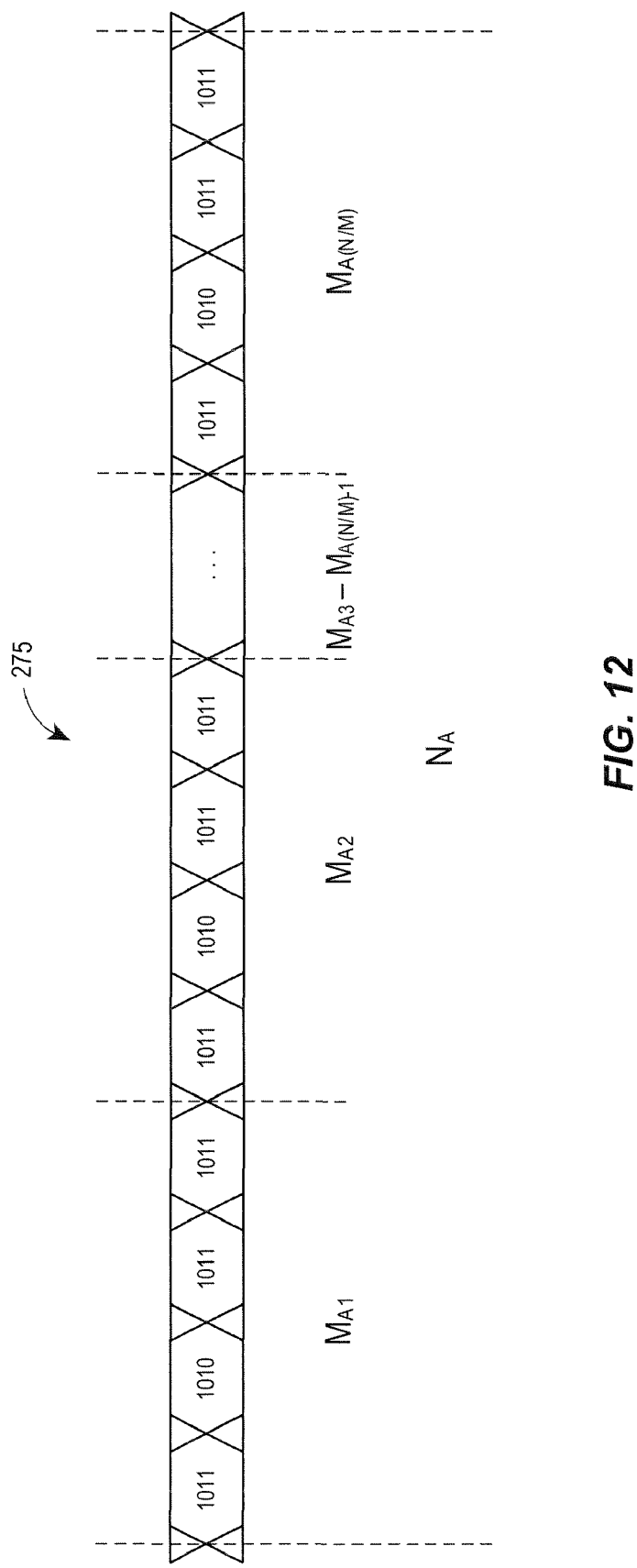
FIG. 12 depicts an exemplary timing diagram illustrative of the exemplary digital input signals depicted in FIG. 8.

FIG. 10 depicts four datagrams X representing each of the four values ($P_A$-$P_D$) (i.e., datagrams $X_{A1}$-$X_{A4}$ represent parameter value $P_A$, datagrams $X_{B1}$-$X_{B4}$ represent parameter value $P_B$, etc.). Of course, each value P of the parameter need not be represented by only a single set of S datagrams, as illustrated in FIG. 10. FIG. 12 illustrates an exemplary timing diagram 275 showing the datagrams representing a single value P of the example parameter $P_A$ of FIG. 10. The value $P_A$ of the parameter is valid for a period $N_A$ (i.e., the meter 100 updates the value P of the parameter every $N_A$ seconds). The processor 160 transmits the S datagrams in a period M, that is significantly shorter than the period N, and preferably is at least an order of magnitude shorter than the period N. Thus, the S datagrams representing a value P of the parameter may repeat N/M times during a measurement cycle having a period N, as FIG. 12 illustrates. For instance, if the meter 100 updates the value P of the parameter every 100 ms (i.e., N=100 ms), and the output of the DAC 155 updates every 250 µs (i.e., each datagram is 250 µs long and each period M is 1 ms), then the four datagrams representing value P of the parameter would repeat 100 times before the meter 100 updates the value P of the parameter. Of course, while the examples herein contemplate the use of a serial digital-to-analog converter, those of skill in the art will recognize that the meter 100 may also employ the method 200 in cooperation with a parallel digital-to-analog converter.

Although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . ." or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

Although the disclosure herein has been described with reference to particular illustrative embodiments, it is to be understood that these embodiments are merely illustrative of the principles and applications of the present disclosure. Therefore, numerous modifications may be made to the illustrative embodiments and other arrangements may be devised without departing from the spirit and scope of the present disclosure, which is defined by the appended claims.

I claim:

1. A method for improving the resolution of an analog signal relative to a digital signal, the analog and digital signals representative of a numerical value, the method comprising:

forming, from one or more sensors operatively coupled with an AC electrical service, one or more first analog signals representative of at least a voltage or a current of the AC electrical service;

converting the one or more first analog signals into one or more first digital signals representative of the one or more analog signals;

receiving the one or more first digital signals;

determining, from at least one of the one or more first digital signals a value of a parameter of the AC electrical service;

transmitting a second digital signal indicative of the value of the parameter of the AC electrical service, the second digital signal comprising a plurality of datagrams, each datagram having a first resolution; and receiving the second digital signal indicative of the value of the parameter of the AC electrical service, wherein the plurality of datagrams have an average value indicative of the value of the parameter, the average value having a second resolution exceeding the first resolution.

2. The method of claim 1 further comprising converting the second digital signal indicative of the value of the parameter of the AC electrical service to a second analog signal indicative of the value of the parameter of the AC electrical service.

3. The method of claim 1 wherein the parameter of the AC electrical service is selected from one of energy, revenue, real power, reactive power, total power, a power factor, or an instantaneous or root mean square (RMS) value of one of a line voltage, a line current, a phase voltage, a phase current, and a total harmonic distortion (THD).

4. A digital electrical power and energy meter comprising:

a sensor coupled to an AC electrical service and generating a first analog signal representative of a voltage or a current of the AC electrical service;

an analog-to-digital converter, for converting the first analog signal to a first digital signal;

a memory unit for storing a plurality of executable instructions; and a processor coupled to the memory unit, wherein when the plurality of executable instructions are executed the processor is configured to determine from at least the first digital signal a value of a parameter of the AC electrical service and to construct a second digital signal indicative of the value of the parameter of the AC electrical service by determining a plurality of datagrams having an average value indicative of the value of the parameter of the AC electrical service, wherein each datagram has a first resolution and the average value has a second resolution exceeding the first resolution and configured to output the second digital signal.

5. The device of claim 4 further comprising:

a digital-to-analog converter for converting the second digital signal to a second analog signal, the second analog signal indicative of the value of the parameter of the AC electrical service; and an analog output for communicatively coupling the meter with an external device, the analog output transmitting the second analog signal to the external device.

6. The device of claim 4 wherein the parameter of the AC electrical service is selected from one of energy, revenue, real power, reactive power, total power, a power factor, or an instantaneous or root mean square (RMS) value of one of a line voltage, a line current, a phase voltage, a phase current, and a total harmonic distortion (THD).

7. A digital electrical power and energy meter comprising:
a sensor coupled to an AC electrical service and generating a first analog signal representative of at least a voltage or a current of the AC electrical service;
an analog-to-digital converter, for converting the first analog signal to a first digital signal;
a memory unit for storing a plurality of executable instructions; and
a processor coupled to the memory unit, wherein when the plurality of executable instructions are executed the processor is configured to determine from at least the first digital signal, a value of a parameter of the AC electrical service and to construct a second digital signal indicative of the value of the parameter for the AC electrical service comprising a series of digital representations of the value of the parameter of the AC electrical service, and
wherein the processor is further configured to output the second digital signal by varying the value of the series of digital representations of the value of the parameter of the AC electrical service, such that the average of the series of digital representations of the value of the parameter of the AC electrical service has a higher resolution than each of the series of digital representations.

8. The device of claim 7 further comprising:
a digital-to-analog converter, for converting the second digital signal to a second analog signal, the second analog signal indicative of the value of the parameter of the AC electrical service; and
an analog output for communicatively coupling the meter with an external device, the analog output transmitting the second analog signal to the external device, and
wherein the digital-to-analog converter converts the series of digital representations of the value of the parameter of the AC electrical service to a series of analog representations of the value of the parameter.

9. The device of claim 7 wherein the parameter of the AC electrical service is selected from one of energy, revenue, real power, reactive power, total power, a power factor, or an instantaneous or root mean square (RMS) value of one of a line voltage, a line current, a phase voltage, a phase current, and a total harmonic distortion (THD).

10. A digital electrical power and energy meter comprising:
a sensor coupled to an AC electrical service and generating a first analog signal representative of at least a voltage or a current of the AC electrical service;
an analog-to-digital converter, for converting the first analog signal to a first digital signal, the first digital signal comprising a plurality of data points;
a memory unit for storing a plurality of executable instructions; and
a processor coupled to the memory unit, wherein when the plurality of executable instructions are executed the processor is configured to determine, from at least the first digital signal, a value of a parameter of the AC electrical service for at least one of the plurality of data points, configured to construct a second digital signal, the second digital signal indicative of the value of the parameter of the AC electrical service for the at least one data point, by determining a plurality of datagrams for each of the at least one data points, wherein each datagram has a first resolution and
the average of the plurality of datagrams has a second resolution greater than the first resolution,
wherein the processor is further configured to output the second digital signal.

11. The device of claim 10 further comprising:
a digital-to-analog converter, for converting the second digital signal to a second analog signal, the second analog signal indicative of the value of the parameter of the AC electrical service for the at least one data point, and the digital-to-analog converter having a first resolution; and
an analog output for communicatively coupling the meter with an external device, the analog output transmitting the second analog signal to the external device,
wherein the digital-to-analog converter converts each of the plurality of datagrams to an analog representation of the value of the parameter of the AC electrical service.

12. The device of claim 10 wherein the parameter of the AC electrical service is selected from one of energy, revenue, real power, reactive power, total power, a power factor, or an instantaneous or root mean square (RMS) value of one of a line voltage, a line current, a phase voltage, a phase current, and a total harmonic distortion (THD).

13. A method for communicating a value of a parameter of an AC electrical service from a digital electrical power and energy meter to an external device, the method comprising:
forming a first analog signal representative of at least a voltage or a current of the AC electrical service;
converting the first analog signal into a first digital signal representative of the first analog signal, the first digital signal comprising a plurality of data points;
receiving the first digital signal;
determining, from at least the first digital signal, a value of a parameter of the AC electrical service for at least one of the plurality of data points;
transmitting a second digital signal indicative of the value of the parameter of the AC electrical service for the at least one data point, the second digital signal having a first resolution; and
receiving the second digital signal indicative of the value of the parameter of the AC electrical service for the at least one data point,
wherein the second digital signal comprises a plurality of datagrams for each of the at least one data points, each datagram having the first resolution, and
wherein the average value of the datagrams has a second resolution greater than the first resolution.

14. The method of claim 13 further comprising:
converting the second digital signal to a second analog signal, the second analog signal indicative of the value of the parameter of the AC electrical service for the at least one data point, and
converting each of the plurality of datagrams to an analog representation of the value of the parameter of the AC electrical service.

15. The method of claim 13 wherein the parameter of the AC electrical service is selected from one of energy, revenue, real power, reactive power, total power, a power factor, or an instantaneous or root mean square (RMS) value of one of a line voltage, a line current, a phase voltage, a phase current, and a total harmonic distortion (THD).

16. A method for improving the resolution of an analog signal relative to a digital signal, the analog and digital signals representative of a numerical value, the method comprising:
forming, from one or more sensors operatively coupled with an AC electrical service, one or more first analog signals representative of at least a voltage or a current of the AC electrical service;
converting the one or more first analog signals into one or more digital signals representative of the one or more analog signals;

determining, from at least one of the one or more digital signals, a value of a parameter of the AC electrical service; and converting the determined value of the parameter of the AC electrical service by a digital-to-analog converter to a second analog signal representative of the determined value of the parameter of the AC electrical service, the converting further includes determining a predetermined number of datagrams, each datagram including a string of binary values indicative of the determined value of the parameter of the AC electrical service, the average of the value of the predetermined number of dataqrams substantially equals the determined value of the parameter of the AC electrical service, wherein the effective resolution of the second analog signal is higher than a bit resolution of the digital-to-analog converter.

17. The method of claim 16, wherein bit resolution of the digital-to-analog converter determines the number of binary values in each datagram.

18. The method of claim 16, wherein the predetermined number of datagrams is based on a desired resolution of the second analog signal.

19. The method of claim 18, wherein the higher the predetermined number of datagrams the higher the resolution of the second analog signal.

20. The method of claim 18, wherein the increase in resolution of the second analog signal is determined by the formula:

$$S=2^n$$

where S equals the predetermined number of datagrams and n equals the increase in bit resolution of the second analog signal.

21. The method of claim 16, further comprising determining a duty cycle of each datagram over the predetermined number of datagrams and transmitting each datagram at the determined duty cycle.

22. The method of claim 16, wherein the second analog signal includes a plurality of analog values, each analog value corresponding to each datagram of the predetermined number of datagram, wherein the average of analog values is indicative of the determined value of the parameter of the AC electrical service.

23. A digital electrical power and energy meter comprising:
  at least one sensor coupled to an AC electrical service and generating a first analog signal representative of a voltage or a current of the AC electrical service;
  at least one analog-to-digital converter for converting the first analog signal to a first digital signal;
  at least one memory unit for storing a plurality of executable instructions;
  at least one processor coupled to the at least one memory unit, wherein when the plurality of executable instructions are executed the processor is configured to determine from the first digital signal a value of a parameter of the AC electrical service and to construct a series of digital representations of the value of the parameters of the AC electrical service, wherein an average of the series of digital representations substantially equals the determined value of the parameter of the AC electrical service; and
  at least one digital-to-analog converter for converting the series of digital representations to a second analog signal representative of the determined value of the parameter of the AC electrical service, wherein the effective resolution of the second analog signal is higher than a bit resolution of the digital-to-analog converter.

24. The meter of claim 23, wherein the at least one processor is further configured to determine a predetermined number of datagrams, each datagram including a string of binary values indicative of the determined value of the parameter of the AC electrical service.

25. The meter of claim 24, wherein bit resolution of the at least one digital-to-analog converter determines the number of binary values in each datagram.

26. The meter of claim 24, wherein the predetermined number of datagrams is based on a desired resolution of the second analog signal.

27. The meter of claim 26, wherein the higher the predetermined number of datagrams the higher the resolution of the second analog signal.

28. The meter of claim 26, wherein the increase in resolution of the second analog signal is determined by the formula:

$$S=2^n$$

where S equals the predetermined number of datagrams and n equals the increase in bit resolution of the second analog signal.

29. The meter of claim 24, wherein the at least one processor is further configured to determine a duty cycle of each datagram over the predetermined number of datagrams, and the at least one digital-to-analog converter transmits each datagram at the determined duty cycle.

30. The meter of claim 24, wherein the second analog signal includes a plurality of analog values, each analog value corresponding each datagram of the predetermined number of datagram, wherein the average of analog values is indicative of the determined value of the parameter of the AC electrical service.

31. The meter of claim 23, further comprising an interface coupled to the at least one digital-to-analog converter to communicate the second analog signal to an external device.

32. The meter of claim 31, wherein the external device is a remote display for displaying the determined value of the parameter of the AC electrical service.

33. The meter of claim 31, wherein the external device is a remote terminal unit (RTU).

34. The meter of claim 31, wherein the interface provides the second analog signal as a 0-1mA output, a 4-20mA output or a 0-5V output.

35. The meter of claim 23, wherein the at least one digital-to-analog converter is disposed on an input/output (I/O) module disposed in the meter.

36. The meter of claim 23, wherein the at least one processor and at least one digital-to-analog converter are disposed on a single input/output (I/O) module disposed in the meter.

37. The meter of claim 31, wherein the at least one digital-to-analog converter and the interface are disposed on a single input/output (I/O) module disposed in the meter.

38. A method for improving the resolution of an analog output signal, the method comprising:
  forming, from one or more sensors operatively coupled with an AC electrical service, one or more first analog input signals representative of at least a voltage or a current of the AC electrical service;
  converting, by an analog-to-digital converter having a predetermined resolution, the one or more first analog input signals into one or more digital signals representative of the one or more analog signals;

determining, from at least one of the one or more digital signals, a value of a parameter of the AC electrical service;

determining a predetermined number of datagrams based on a desired resolution of the analog output signal, each datagram including a string of binary values indicative of the determined value of the parameter of the AC electrical service and converting the determined value of the parameter of the AC electrical service by a digital-to-analog converter to the analog output signal representative of the determined value of the parameter of the AC electrical service by processing the predetermined number of datagrams, wherein the predetermined number of datagrams have an average value substantially equal to the determined value of the parameter of the AC electrical service such that the resolution of the analog output signal is higher than the predetermined resolution of the analog-to-digital converter.

39. A digital electrical power and energy meter comprising:
- at least one sensor coupled to an AC electrical service and generating a first analog signal representative of a voltage or a current of the AC electrical service;
- at least one analog-to-digital converter for converting the first analog signal to a first digital signal with at least 12 bits of resolution;
- at least one memory unit for storing a plurality of executable instructions;
- at least one processor coupled to the at least one memory unit, wherein when the plurality of executable instructions are executed the processor is configured for determining from the first digital signal a value of a parameter of the AC electrical service; and
- at least one digital-to-analog converter, wherein the at least one digital-to-analog converter converts a plurality of datagrams into a corresponding plurality of analog signals, wherein the plurality of datagrams are selected so the corresponding plurality of analog signals when averaged are substantially equal to the determined value of the parameter of the AC electrical service and the averaged value has a resolution higher than a resolution of the digital-to-analog converter.

40. A digital electrical power and energy meter comprising:
- at least one sensor coupled to an AC electrical service and generating a first analog signal representative of a voltage or a current of the AC electrical service;
- at least one analog-to-digital converter for converting the first analog signal to a first digital signal with at least 18 bits of resolution;
- at least one memory unit for storing a plurality of executable instructions;
- at least one processor coupled to the at least one memory unit, wherein when the plurality of executable instructions are executed the processor is configured for determining from the first digital signal a value of a parameter of the AC electrical service; and
- at least one digital-to-analog converter, wherein the at least one digital-to-analog converter converts a plurality of datagrams into a corresponding plurality of analog signals, wherein the plurality of datagrams are selected so the corresponding plurality of analog signals when averaged are substantially equal to the determined value of the parameter of the AC electrical service and the averaged value has a resolution higher than a resolution of the digital-to-analog converter.

* * * * *